United States Patent
Genc et al.

(10) Patent No.: US 11,405,035 B1
(45) Date of Patent: Aug. 2, 2022

(54) GATE RESISTOR BYPASS FOR RF FET SWITCH STACK

(71) Applicant: pSemi Corporation, San Diego, CA (US)

(72) Inventors: Alper Genc, San Diego, CA (US); Fleming Lam, San Diego, CA (US); Eric S. Shapiro, San Diego, CA (US); Ravindranath Shrivastava, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/374,927

(22) Filed: Jul. 13, 2021

(51) Int. Cl.
*H03K 17/687* (2006.01)
*H03K 19/21* (2006.01)

(52) U.S. Cl.
CPC ......... *H03K 17/6872* (2013.01); *H03K 19/21* (2013.01)

(58) Field of Classification Search
CPC combination set(s) only.
See application file for complete search history.

(56) References Cited

U.S. PATENT DOCUMENTS

| | | | |
|---|---|---|---|
| 7,910,993 B2 | 3/2011 | Brindle et al. | |
| 9,184,731 B2 | 11/2015 | Fleming | |
| 9,893,722 B2 * | 2/2018 | Mokalla | H03K 17/04106 |
| 10,236,872 B1 | 3/2019 | Willard et al. | |
| 10,396,772 B2 | 8/2019 | Shanjani et al. | |
| 10,763,842 B1 | 9/2020 | Dai | |
| 10,886,911 B2 | 1/2021 | Willard et al. | |
| 2013/0033307 A1 | 2/2013 | Lin | |
| 2016/0329891 A1 | 11/2016 | Bakalski et al. | |
| 2017/0302259 A1 | 10/2017 | Mokalla | |
| 2021/0075420 A1* | 3/2021 | Kovac | H03K 17/063 |

OTHER PUBLICATIONS

Non-Final Office Action for U.S. Appl. No. 17/321,363, filed May 14, 2021, on behalf of pSemi Corporation, dated Sep. 15, 2021. 14 Pages.
Final Office Action for U.S. Appl. No. 17/321,363, filed May 14, 2021, on behalf of pSemi Corporation, dated Mar. 15, 2022. 15 Pages.

* cited by examiner

*Primary Examiner* — Long Nguyen
(74) *Attorney, Agent, or Firm* — Steinfl + Bruno LLP (57) ABSTRACT

A common gate resistor bypass arrangement for a stacked arrangement of FET switches, the arrangement including a series combination of an nMOS transistor and a pMOS transistor connected across a common gate resistor. During at least a transition portion of the transition state of the stacked arrangement of FET switches, the nMOS transistor and the pMOS transistor are both in an ON state and bypass the common gate resistor. On the other hand, during at least a steady state portion of the ON steady state and the OFF steady state of the stacked arrangement of FET switches, one of the nMOS transistor and the pMOS transistor is in an OFF state and the other of the nMOS transistor and the pMOS transistor is in an ON state, thus not bypassing the common gate resistor.

20 Claims, 12 Drawing Sheets

GATE RESISTOR BYPASS FOR RF FET SWITCH STACK

FIELD

The present disclosure relates to integrated circuit devices, and more particularly to methods and apparatus for reducing the switching time by bypassing the gate resistor of switching devices.

BACKGROUND

Figure 1:
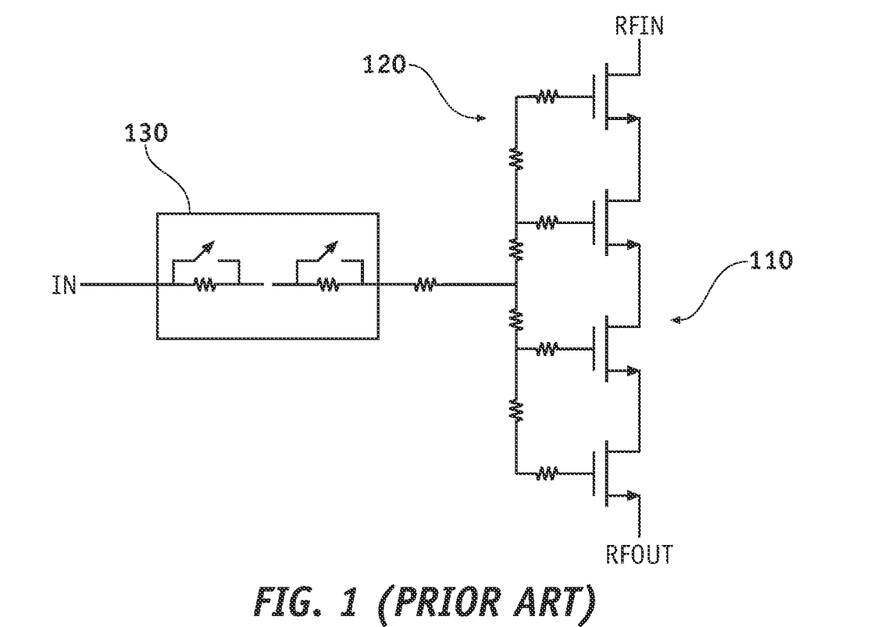
FIG. 1 shows a prior art FET switch with a gate resistor bypass.

FIG. 1 shows a schematic representation of an RF switch FET stack (110) with input RFIN and output RFOUT. FET stack (120) is biased through resistor networks, such as body, drain/source and gate rail/rung resistor ladders, of which only gate resistor ladder (120) is shown in the figure, for ease of reference. Input (IN) controls the bias on the gate terminals of the FETs of the FET stack. FET stack (110) also includes a resistor bypass block (130). Resistor bypass block (130) includes one or more transition-dependent gate bias feed bypass resistors (also called dynamic resistors), as described, for example, in U.S. Pat. No. 10,396,772, incorporated herein by reference in its entirety.

SUMMARY

The present application describes a novel type of gate control block, as described in detail in the following figures. Such novel type of gate control block will be sometimes referred to as dynamic gate control throughout the present disclosure.

According to a first aspect of the present disclosure, a FET switch stack is provided, comprising: a stacked arrangement of FET switches connected at one end to an RF terminal configured to be coupled to an RF signal, the FET switch stack configured to have an ON or OFF steady state where the FET switches are respectively ON or OFF and a transition state where the FET switches transition from ON to OFF or vice versa; a gate resistor network comprising resistors connected to gate terminals of the FET switches and one or more common gate resistors connected to the gate resistor network, the gate resistor network and the one or more common gate resistors configured to feed a gate control voltage (IN) to the gate terminals of the FET switches; and a common gate resistor bypass arrangement comprising at least one series combination of an nMOS transistor and a pMOS transistor connected across the one or more common gate resistors and configured to i) bypass the one or more common gate resistors during at least a transition portion of the transition state of the stacked arrangement of FET switches, the nMOS transistor and the pMOS transistor being both in an ON state during said transition portion, and ii) not to bypass the one or more common gate resistors during at least a steady state portion of the ON steady state and the OFF steady state of the stacked arrangement of FET switches, one of the nMOS transistor and the pMOS transistor being in an OFF state and the other of the nMOS transistor and the pMOS transistor being in an ON state during said steady state portion.

According to a second aspect of the present disclosure, a method to controllably bypass a resistor across a series combination of an nMOS transistor and a pMOS transistor is provided, the series combination and the resistor configured to receive a control signal switching from a first static state to a second static state and vice versa, and output the control signal to control ON and OFF status of an RF FET switch, the method comprising: in the first static state of the control signal, setting a gate terminal of the nMOS transistor at a first nMOS gate voltage and a gate terminal of the pMOS transistor at a first pMOS gate voltage, the first nMOS gate voltage selected to set the nMOS transistor in an ON state and the first pMOS gate voltage selected to set the pMOS transistor in an OFF state, the ON state of the nMOS transistor and the OFF state of the pMOS transistor establishing a high impedance status of the series combination and not bypassing the resistor when feeding the control signal to the RF FET switch; during a transition of the control signal from the first state to the second state keeping the gate terminal of the pMOS transistor at the first pMOS gate voltage, thereby setting the pMOS transistor in an ON state, and feeding, for at least a portion of the transition, the gate terminal of the nMOS transistor with a second nMOS gate voltage higher than the first nMOS gate voltage, thereby keeping the nMOS transistor in the ON state, the ON state of the nMOS transistor and the ON state of the pMOS transistor establishing a low impedance status of the series combination and bypassing the resistor when feeding the control signal to the RF FET switch; and in the second static state of the control signal, keeping the gate terminal of the pMOS transistor at the first pMOS gate voltage, thereby keeping the pMOS transistor in the ON state, and feeding the gate terminal of the nMOS transistor with the first nMOS gate voltage, thus setting the nMOS transistor in an OFF state, the OFF state of the nMOS transistor and the ON state of the pMOS transistor re-establishing a high impedance status of the series combination and not bypassing the resistor when feeding the control signal to the RF FET switch. The method may be implemented as part of a silicon-on-insulator (SOI) process.

The details of one or more embodiments of the invention are set forth in the accompanying drawings and the description below. Other features, objects, and advantages of the invention will be apparent from the description and drawings, and from the claims.

DETAILED DESCRIPTION

Figure 2A:
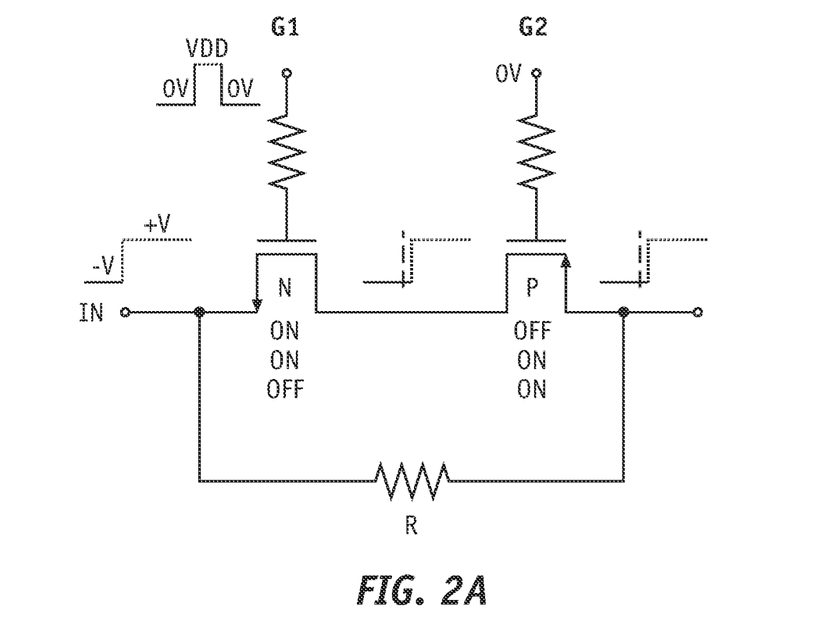
FIGS. 2A-2B show a schematic diagram of an embodiment of the dynamic gate according to the present disclosure, including a series combination of an nMOS transistor and a pMOS transistor.
Figure 2B:
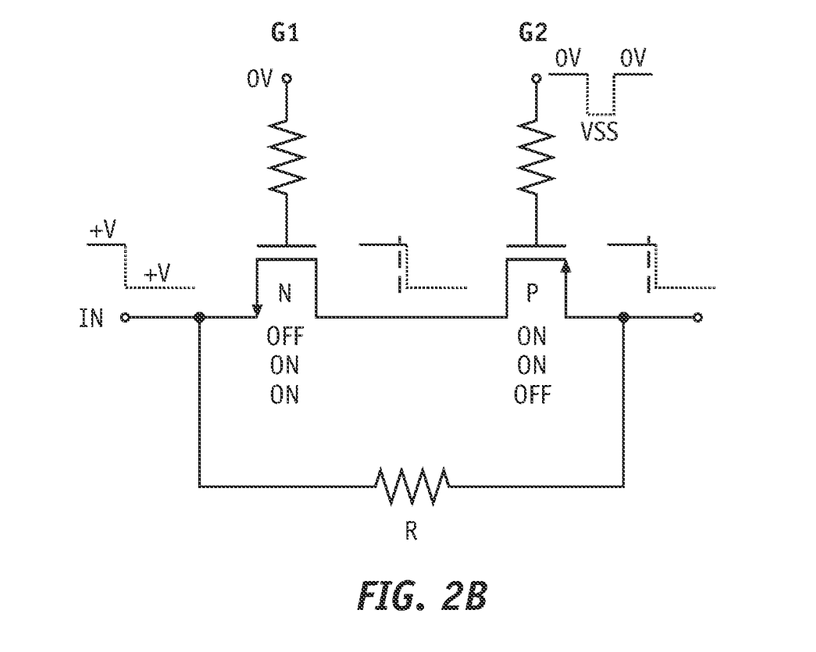

FIGS. 2A and 2B show a schematic diagram of an embodiment of the dynamic gate according to the present disclosure, including a series combination of an nMOS transistor and a pMOS transistor across a resistor R. The dynamic gate is configured to receive the voltage input signal IN (i.e. the signal that controls the switching status of the main RF switch (110) of FIG. 1 at the gate of each transistor of the RF switch) at the source of the nMOS transistor and feed the signal to the RF switch (110) through the gate resistive ladder (120) of FIG. 1 coupled to the source of the pMOS transistor.

The input signal IN transitions from a first, high, static state (called VDD, +V or V+ throughout the present disclosure, e.g. +3V) to a second, low, static state (called VSS, –V or V– throughout the present disclosure, e.g. –3V) and vice versa. FIG. 2A shows behavior of the dynamic gate when the input signal IN transitions from V– to V+, while FIG. 2B shows behavior of the dynamic gate when the input signal IN transitions from V+ to V–.

With reference to FIG. 2A, in the static condition IN=–V, the gate terminals G1 and G2 of the nMOS transistor and the pMOS transistor, respectively, are at 0V. The source terminal of the nMOS transistor sees a negative signal, therefore keeping the nMOS transistor in ON state. The potential of the internal node between the nMOS transistor and the pMOS transistor will be forced to about –V by the drain voltage of the nMOS transistor. On the other hand, given that also the source terminal of the pMOS transistor sees a negative signal (through R), the pMOS transistor will be in an OFF state. These conditions are graphically represented in FIG. 2A by the upper wording "ON" right under the nMOS transistor and the upper wording "OFF" right under the pMOS transistor. In this static condition, there is no resistor bypass and the input signal IN is fed to the gates of the transistors of the main RF switch through resistor R (high impedance status).

With continued reference to FIG. 2A, when the input signal IN begins to transition from –V to +V, the pMOS transistor soon exits the OFF state and goes into an ON state, as its gate voltage is being kept at 0V while the voltage at its drain terminal increases due to the voltage increase at the intermediate node between the nMOS transistor and the pMOS transistor. The ON state of the pMOS transistor during the transition is being graphically represented in FIG. 2A by the middle wording "ON" under the pMOS transistor. On the other hand, the gate voltage of the nMOS transistor starts receiving a positive (e.g. VDD) pulse during or within a portion of the transition time window, as also shown by the square pulse representation close to gate G1 in FIG. 2A. The presence of the positive pulse on the gate G1 of the nMOS transistor while the voltage IN on its source transitions from –V to +V allows the nMOS transistor to stay ON during or within a portion of the transition time window. The ON state of the nMOS transistor during the transition is being graphically represented in FIG. 2A by the middle wording "ON" under the nMOS transistor.

As a consequence, there will be a time interval inside the V– to V+ transition, having the duration of the transition or a portion thereof, where both the nMOS transistor and the pMOS transistor will be in the ON state. In this condition, the resistor R is effectively bypassed and the input signal IN is fed to the gates of the transistors of the main RF switch through the transistors (low impedance status). As soon as the transition ends, the input signal IN reaches a steady voltage +V. This value, coupled with the 0V voltage at gates G1 and G2 (as the voltage of G1 returns to 0V at the end of the positive pulse) will put the nMOS transistor in an OFF state (see bottom wording "OFF" under the nMOS transistor) and keep the pMOS transistor in an ON state (see bottom wording "ON" under the pMOS transistor), thus returning the dynamic gate to a high impedance status where the resistor R is not bypassed.

Reference will now be made to FIG. 2B, where considerations similar to those just exposed above will be presented. In particular, with reference to FIG. 2B, in the static condition IN=+V the gate terminals of the nMOS transistor and the pMOS transistor are at 0V. The source terminal of the nMOS transistor sees a positive signal, therefore keeping the nMOS transistor in OFF state. On the other hand, given that also the source terminal of the pMOS transistor sees a positive signal (through R), the pMOS transistor will be in an ON state. The potential of the internal node between the nMOS transistor and the pMOS transistor will be forced to about +V by the drain voltage of the pMOS transistor. These conditions are graphically represented in FIG. 2B by the upper wording "OFF" right under the nMOS transistor and the upper wording "ON" right under the pMOS transistor. In this static condition, there is no resistor bypass and the input signal IN is fed to the gates of the transistors of the main RF switch through resistor R (high impedance status).

With continued reference to FIG. 2B, when the input signal IN begins to transition from +V to –V, the nMOS transistor soon exits the OFF state and goes into an ON state, as its gate voltage is being kept at 0V while the voltage at its source terminal decreases. The ON state of the nMOS transistor during the transition is being graphically represented in FIG. 2B by the middle wording "ON" under the nMOS transistor. On the other hand, the gate voltage of the pMOS transistor starts receives a negative (e.g. VSS) pulse during or within a portion of the transition time window, as also shown by the square pulse representation close to gate G2 in FIG. 2B. The presence of the negative pulse on the gate G2 of the pMOS transistor while the voltage on its drain transitions from +V to –V allows the pMOS transistor to stay ON during or within a portion of the transition time window. The ON state of the pMOS transistor during the transition is being graphically represented in FIG. 2B by the middle wording "ON" under the pMOS transistor.

As a consequence, also in this case, there will be a time interval inside the V+ to V– transition, having the duration of the transition or a portion thereof, where both the nMOS transistor and the pMOS transistor will be in the ON state. In this condition, the resistor R is effectively bypassed and the input signal IN is fed to the gates of the transistors of the main RF switch through the transistors (low impedance status). As soon as the transition ends, the input signal IN reaches a steady voltage –V. This value, coupled with the 0V voltage at gates G1 and G2 will put the pMOS transistor in an OFF state (see bottom wording "OFF" under the pMOS transistor) and keep the nMOS transistor in an ON state (see bottom wording "ON" under the nMOS transistor), thus returning the dynamic gate to a high impedance status where the resistor R is not bypassed.

Upon review of FIGS. 2A-2B and related written description above, the person skilled in the art will note that in the present disclosure the generation of the pulse is in the same direction of the transition. In other words, in FIG. 2A the positive pulse to the gate G1 of the nMOS transistor is formed by a 0-to-VDD step (low to high) while the input signal IN transitions from VSS to VDD (low to high). Similarly, in FIG. 2B, the negative pulse to the gate G2 of the pMOS transistor is formed by a 0-to-VSS step (high to low) while the input signal IN transitions from VDD to VSS (high to low). By having, in both cases, pulse generation heading in the same direction of the input signal transition, the resulting stress on the nMOS and pMOS transistors is advantageously reduced.

Figure 3A:
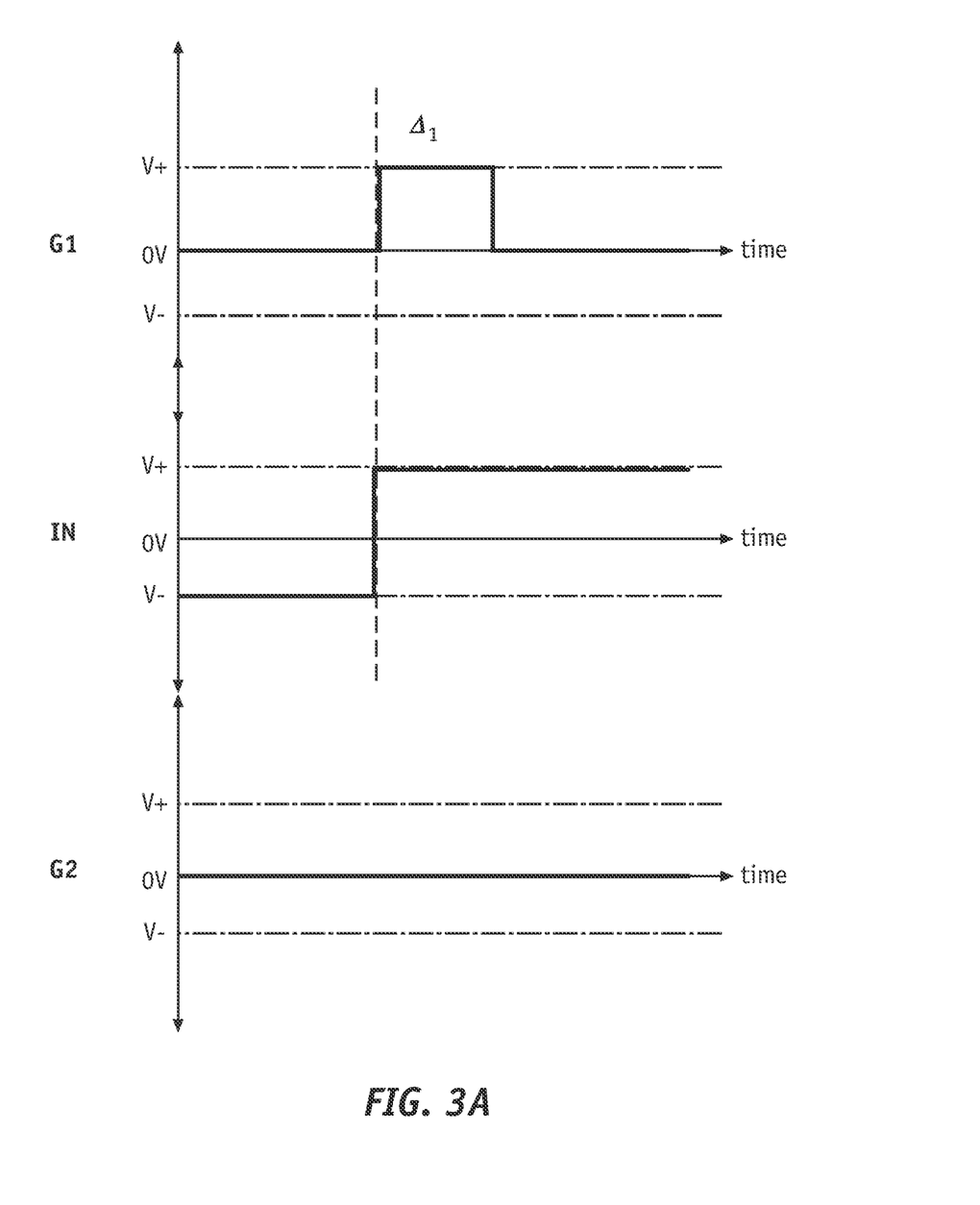
FIGS. 3A-3B show timing diagrams with respect to the embodiments of FIGS. 2A-2B, respectively.
Figure 3B:
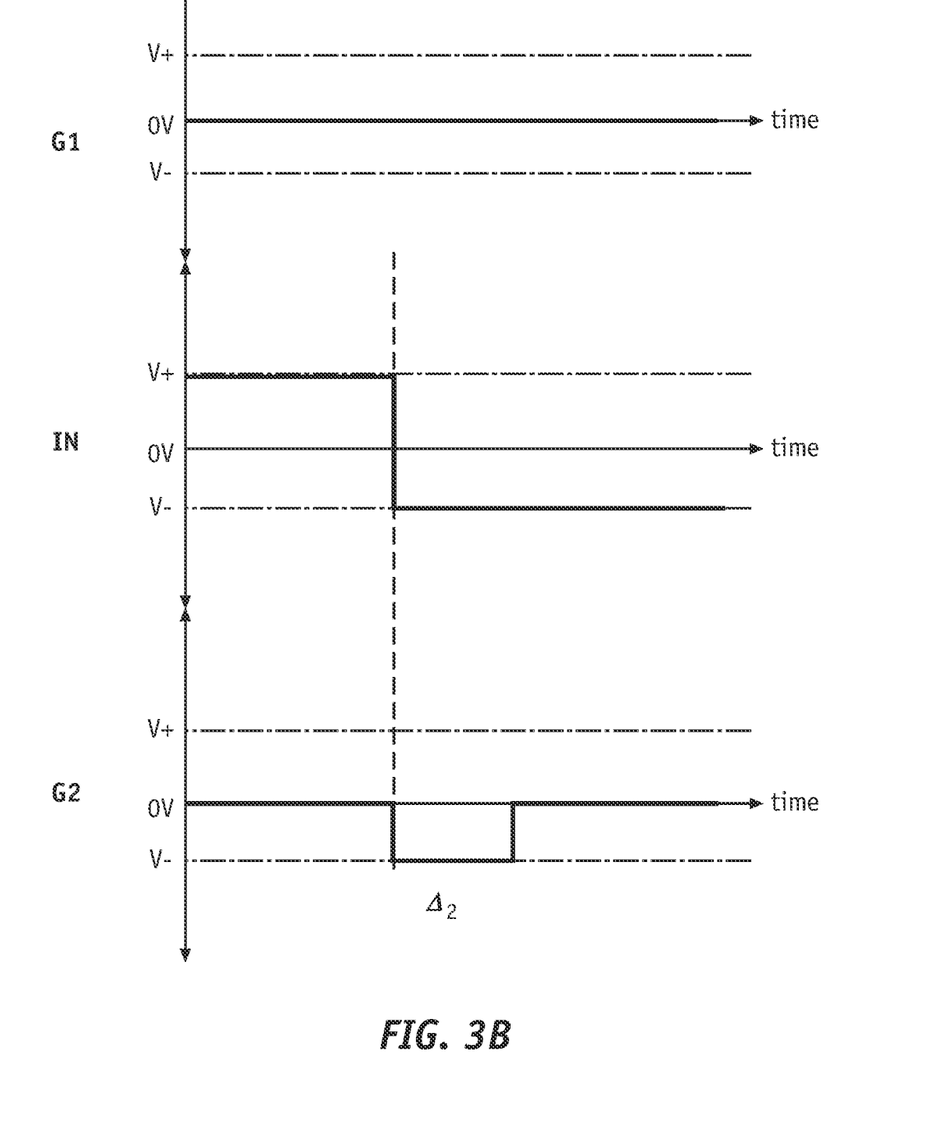

FIGS. 3A and 3B show time diagrams where the timing of the pulses G1 to keep the nMOS ON (FIG. 3A) and G2 to keep the pMOS ON during the transition is shown. In these figures, the durations of the windows 41 (FIG. 3A) and 42 (FIG. 3B) is longer than the duration of the transition, meaning that in both cases the dynamic gate will settle in its new static condition (nMOS transistor OFF, pMOS transistor ON in FIG. 3A and nMOS transistor ON, pMOS transistor OFF in FIG. 3B) a little bit after the signal IN reaches V+(FIG. 3A) or V− (FIG. 3B). The person skilled in the art will understand that the duration of the windows Δ1 and Δ2 can be controlled while designing the dynamic gate according to the present disclosure, depending on the desired duration of the low impedance status of the dynamic gate, meaning that such duration does not necessarily have to coincide with the duration of the transition. For example, with a pulse window starting at the beginning of the transition and ending at the end of the transition a low impedance status will be obtained for the entirety of the transition window. On the other hand, with a pulse window starting at the beginning of the transition and ending after the end of the transition (as shown in FIGS. 3A and 3B) a low impedance status having a duration longer than the transition window can be designed. Therefore, the duration of the pulse can be programmed in accordance with the desired duration of the low impedance status of the dynamic gate.

Upon review of the embodiments of FIGS. 2A-2B and related timing diagrams of FIGS. 3A-3B the person skilled in the art will understand that several modifications, still falling within the scope of the present disclosure, are possible. By way of example, while the figures show the nMOS transistor on the left side and the pMOS transistor on the right side, embodiments are also possible where the order of the transistors is inverted. Additionally, while the figures show a single bypassable resistor R, embodiments are also possible where, e.g., two resistors are provided, with a node between the resistors connected to a node between the transistors. Therefore, whenever the term resistor is used throughout the present specification and claims to indicate the bypassable resistor R, its meaning will not have to be confined to a single resistor, but will also be intended to include two or more resistors.

The positive voltage pulse for the gate of the nMOS transistor with reference to the V− to V+ transition and the negative voltage pulse for the gate of the pMOS transistor with reference to the V+ to V− transition can be generated through a dedicated control circuitry, as shown in FIGS. 4A-4B and FIGS. 5A-5B.

Figure 4A:
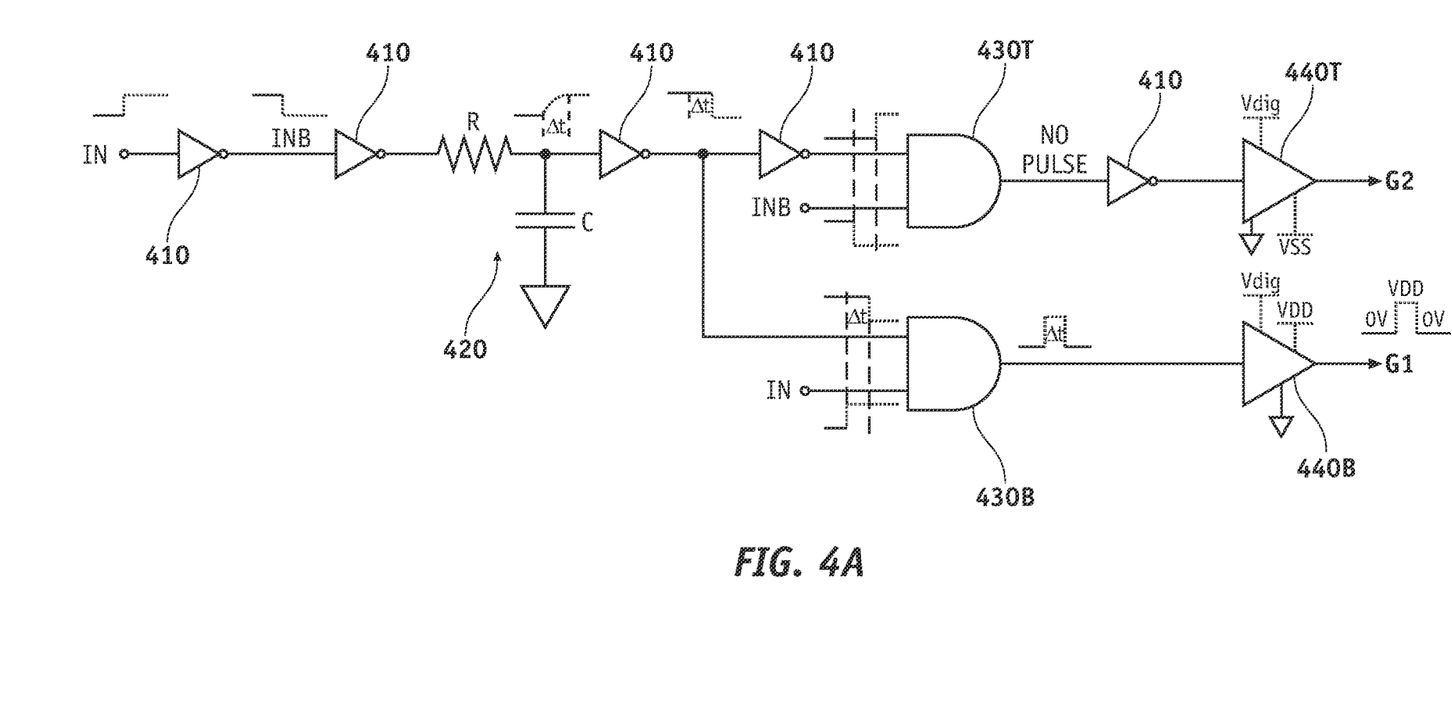
FIGS. 4A-4B show a first embodiment of a control circuitry for use with the dynamic gate of FIGS. 2A-2B, respectively.

FIG. 4A shows a first embodiment of a control circuitry in accordance with the teachings of the present disclosure and its implementation during a V− to V+ transition of the gate control signal IN. The control circuitry comprises a series of inverters (410), a delay unit (420) (e.g. an RC delay unit or other similar implementations), two AND gates (430T and 430B) and two level shifters (440T and 440B), the latter to adjust the amplitude of the pulse to VSS or VDD, where a top path controls the gate of the pMOS transistor and a bottom path controls the gate of the nMOS transistor. A time window corresponding to the duration of the transition or a time interval inside the transition is indicated as Δt. In particular, in case of a V− to V+ transition, the inputs to the AND gate (430T) of the top path are never both high during the window Δt. On the other hand, the inputs to the AND gate (430B) of the bottom path are both high during the window Δt, thus feeding the pulse to the bottom level shifter (440B) and ultimately to the gate G1 of the nMOS transistor.

Figure 4B:
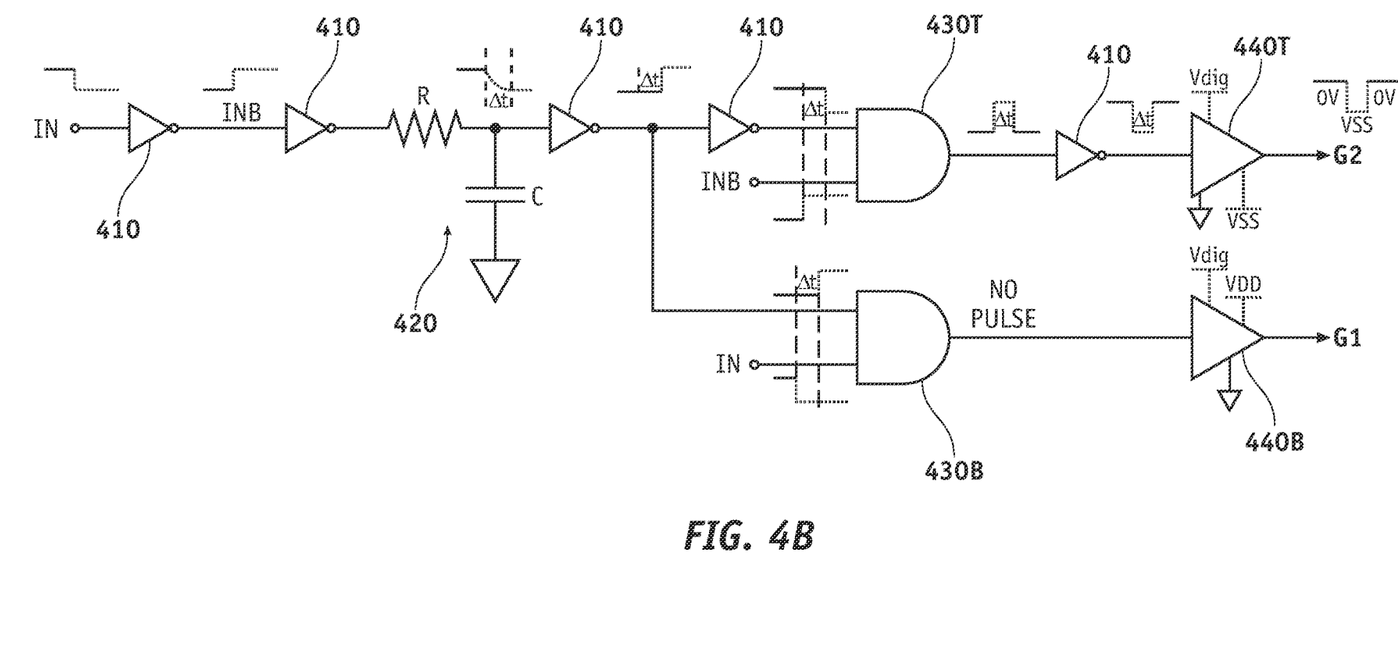

FIG. 4B shows the same circuitry of FIG. 4A, this time during a V+ to V− transition of the gate control signal IN. In such case, the inputs to the AND gate (430B) of the bottom path are never both high during the window Δt. On the other hand, the inputs to the AND gate (430T) of the top path are both high during the window Δt, thus feeding a negative pulse to the top level shifter (440T) and ultimately to the gate G2 of the pMOS transistor.

Figure 5A:
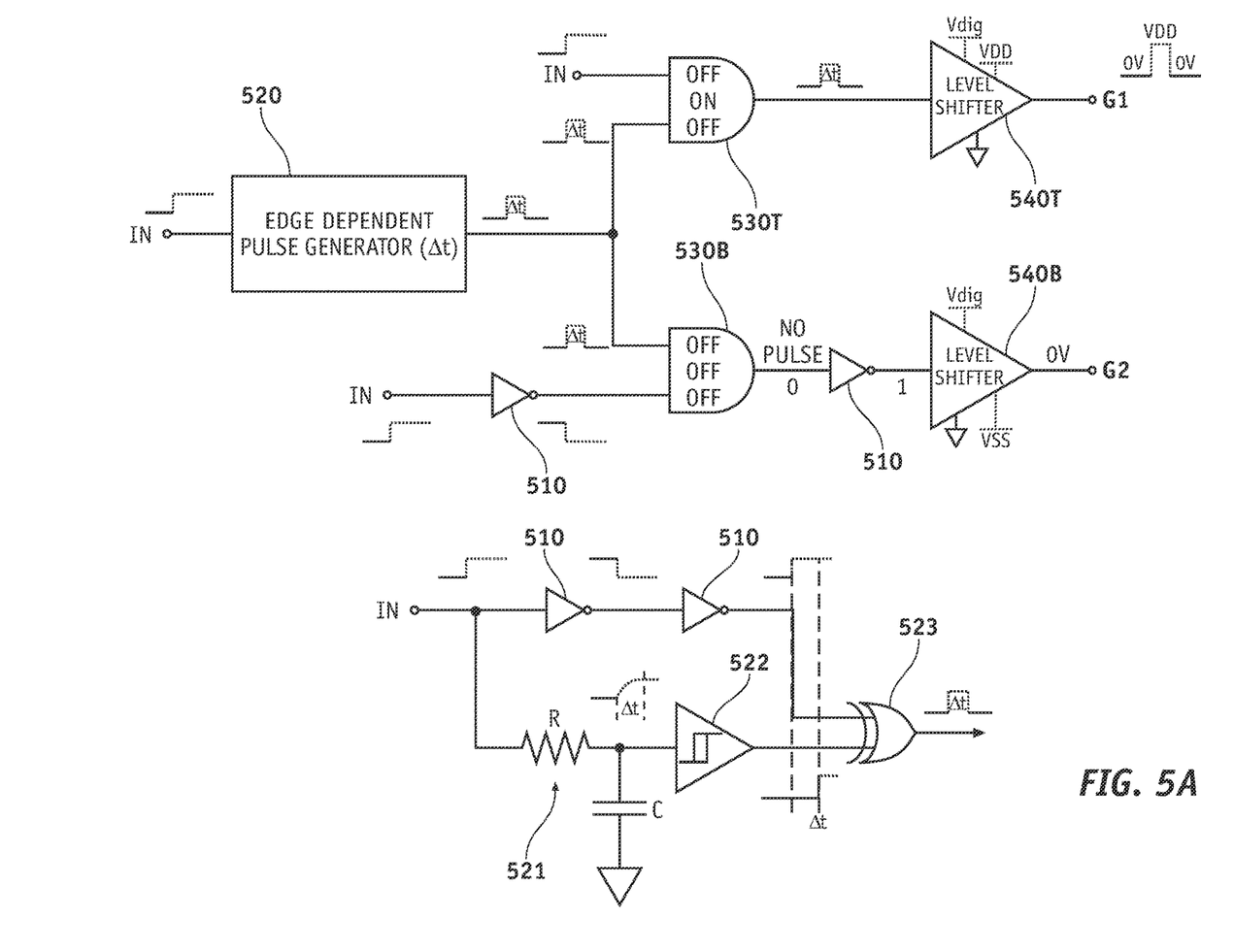
FIGS. 5A-5B show a second embodiment of a control circuitry for use with the dynamic gate of FIGS. 2A-2B, respectively.

FIG. 5A shows a second embodiment of a control circuitry in accordance with the teachings of the present disclosure and its implementation during a V− to V+ transition of the gate control signal IN. The control circuitry comprises a series of inverters (510), an edge dependent pulse generator (520), two AND gates (530T and 530B) and two level shifters (540T and 540B). An implementation of the edge dependent pulse generator (520)—the edge being the V− to V+ transition edge of signal IN− is shown in the bottom part of the figure, inclusive of a delay unit (521), a Schmitt trigger (522) and a XOR gate (523). The edge dependent pulse generator (520) generates a pulse having a duration Δt. In the present case of a V− to V+ transition, the inputs to the AND gate (530T) of the top path (i.e. the input signal IN and the pulse) are both high during Δt, thus feeding a positive pulse to the top level shifter (540T) and ultimately to the gate G1 of the nMOS transistor. On the other hand, the inputs to the AND gate (530B) of the bottom path (i.e. the inverted signal IN and the pulse) are never both high for the duration of the pulse, thus keeping a voltage of 0V on the gate G2 of the pMOS transistor.

Figure 5B:
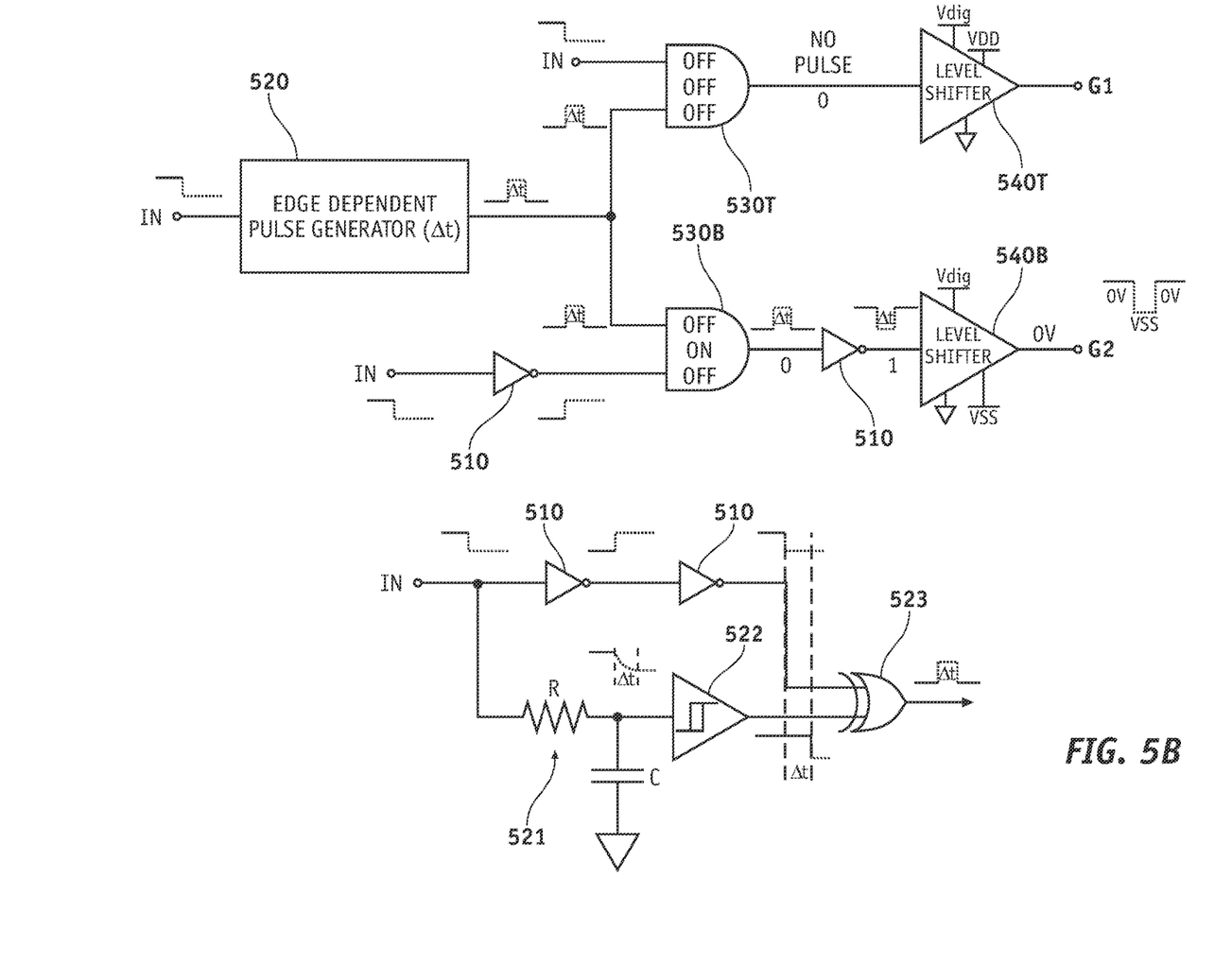

FIG. 5B shows the same circuitry of FIG. 5A, this time during a V+ to V− transition of the gate control signal IN. In such case, the inputs to the AND gate (530T) of the top path are never both high during the transition. On the other hand, the inputs to the AND gate (530B) of the bottom path are both high during the window Δt, thus feeding a negative pulse to the bottom level shifter (540B) and ultimately to the gate of the pMOS transistor.

In both cases of FIGS. 5A and 5B, an embodiment of the pulse generator (520) is shown, where the positive edge of the window Δt is generated exactly at the time of the signal IN switching from V− to V+(FIG. 5A) or from V+ to V− (FIG. 5B) through the presence of the XOR gate (523).

Figure 6:
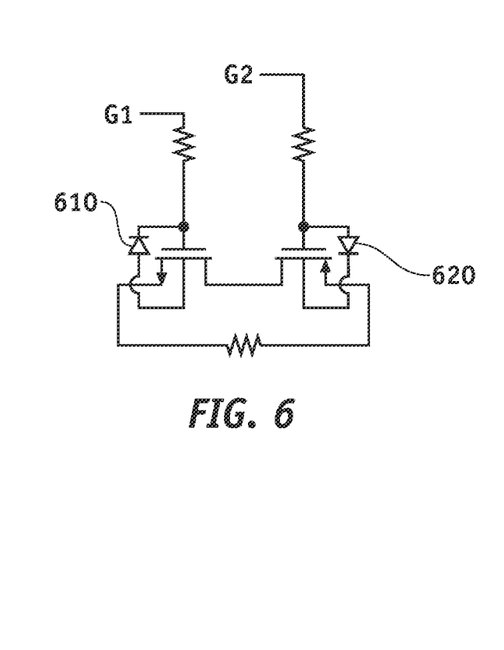
FIG. 6 shows an embodiment where accumulated charge removal diodes are coupled between gate and body terminals of each of the nMOS and pMOS transistors.

FIG. 6 shows an embodiment of the present disclosure where accumulated charge removal arrangements, e.g. diodes (610, 620), are coupled between the gate and the body terminals of each of the nMOS and pMOS transistors. Such accumulated charge removal arrangements or diodes are described, for example, in U.S. Pat. No. 7,910,993, which is incorporated herein by reference in its entirety. Removal of accumulated charges from the body of the nMOS and pMOS transistors has several advantages, such as improvement of harmonic distortion, intermodulation distortion, and linearity performance among others.

Figure 7:
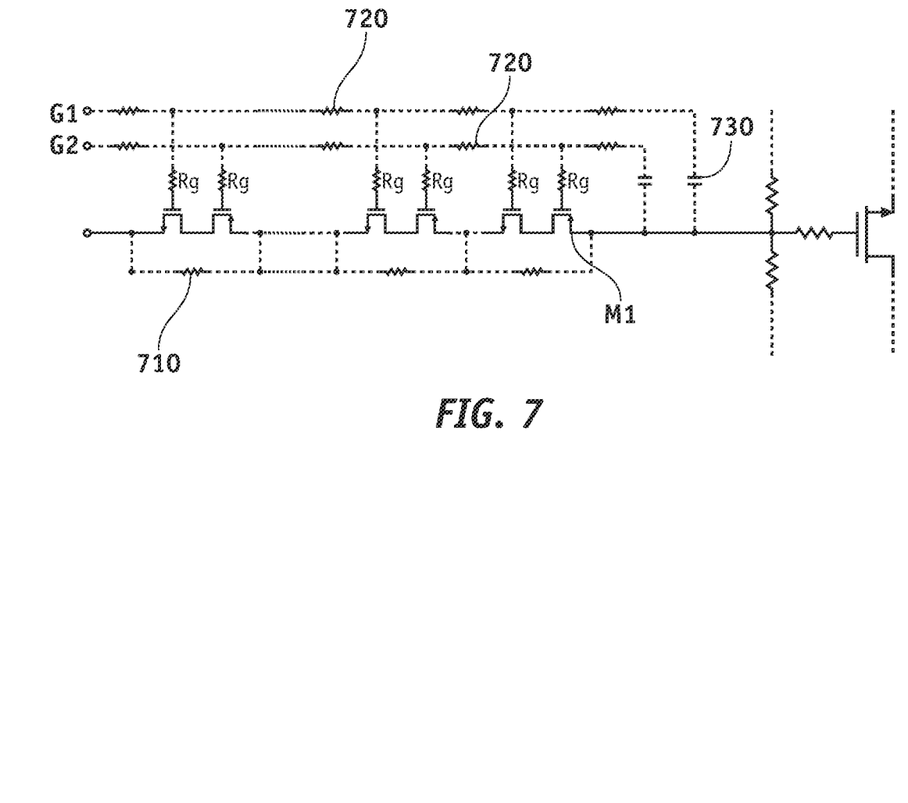
FIG. 7 shows an embodiment where the dynamic gate includes a stacked arrangement of nMOS and pMOS bypass switches.

FIG. 7 shows an embodiment of the dynamic gate arrangement discussed in the previous figures. In the embodiment of FIG. 7 a stacked arrangement of nMOS and pMOS bypass switches across respective bypassable resistors (710) is shown, together with gate resistors (Rg), rail resistors (720) and AC bias capacitors (730) on the right side the stack. Stacks having a large number of nMOS+pMOS switch pairs are preferred in order to allow the switches to withstand the full voltage swing of the RF signal during both the ON and OFF conditions of the main RF switch. While the number of switch pairs in the stack will depend on the type and voltage capabilities of each component switch, a typical number of switch pairs in the stack would be a number equal to the number of switches in the main stack (e.g. 24) or more.

The embodiment of FIG. 7 shows separate gate feed arrangements for the nMOS and pMOS transistors, where rail resistors (720) are provided. The presence of such rail resistors provides for a higher quality factor Q and better voltage division. Also shown is an AC bias, DC blocking, capacitor (730) for each feed arrangement, to improve voltage division across the dynamic gate stack. AC bias capacitors are discussed in detail, for example, in U.S. Pat. No. 10,236,872, owned by applicant and incorporated herein by reference in its entirety.

With continued reference to FIG. 7, during an ON to OFF switching event of the main RF switch, the input voltage IN is changed from V+ to V− e.g. +4V to −3.4V while G2 is switched from 0V to a negative voltage (e.g. −3.4V) to enable the above described turning ON the pMOS transistors in the dynamic gate structure according to the present disclosure. However, during fast transitions, the node G1 of transistor M1 can rapidly change such that the Vgs of M1 experiences a high "peak transient" voltage (e.g. −8.6V) for a period of time, posing a reliability issue for the device.

Figure 8:
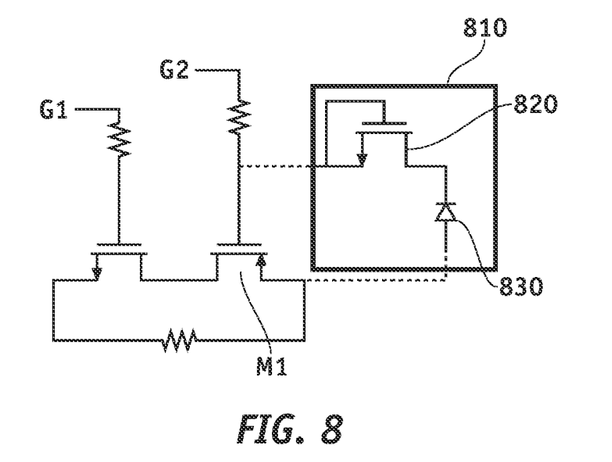
FIG. 8 shows an embodiment of the dynamic gate with a clamp circuit across the pMOS transistor.

In order to mitigate such problem, FIG. 8 shows an embodiment of the dynamic gate according to the present disclosure, where a clamp (i.e. voltage-limiting) circuit (810) across the gate and source terminals of the pMOS transistor is provided. Clamp circuit (810) is made of diode-connected transistor (820) in series with diode (830), the latter coupled between the drain of transistor (820) and the source of the pMOS transistor.

In particular, circuit (810) allows to clamp the internal voltage Vgs of M1 in view of the combination of clamping diode-connected transistor (820) with diode (830). As the gate voltage of M1 drops in potential during the ON to OFF switching event of the main RF switch, diode (830) in series with diode-connected transistor clamp (820) will begin to conduct more current. Further decrease in the gate voltage of M1 will result in a larger potential across the diode +clamp structure (810) such that it conducts more current. The peak current flowing through the diode+clamp structure (810) will advantageously limit the peak Vgs value experienced by M1. Use of a diode-connected transistor (820) instead of a diode is advantageous, because the Vds breakdown of the diode-connected transistor (820) in series with the diode (830) sets the maximum voltage across M1. Using a diode would result in a larger breakdown voltage that would not protect M1.

Figure 9:
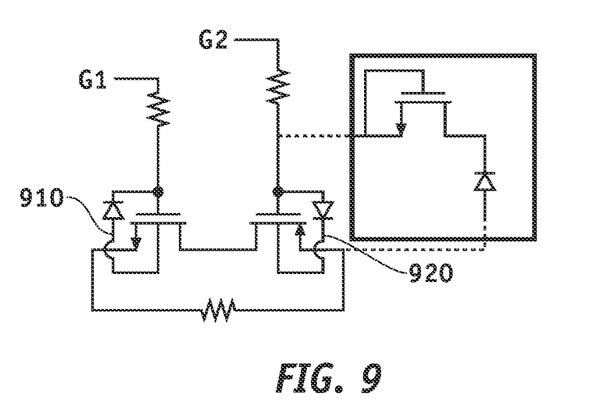
FIG. 9 shows an embodiment similar to the one shown in FIG. 8 where accumulated charge removal diodes are provided.

FIG. 9 shows an arrangement similar to the one shown in FIG. 8 where accumulated charge removal arrangements (e.g. diodes) are provided, similarly to the embodiment previously shown in FIG. 6.

Figure 10:
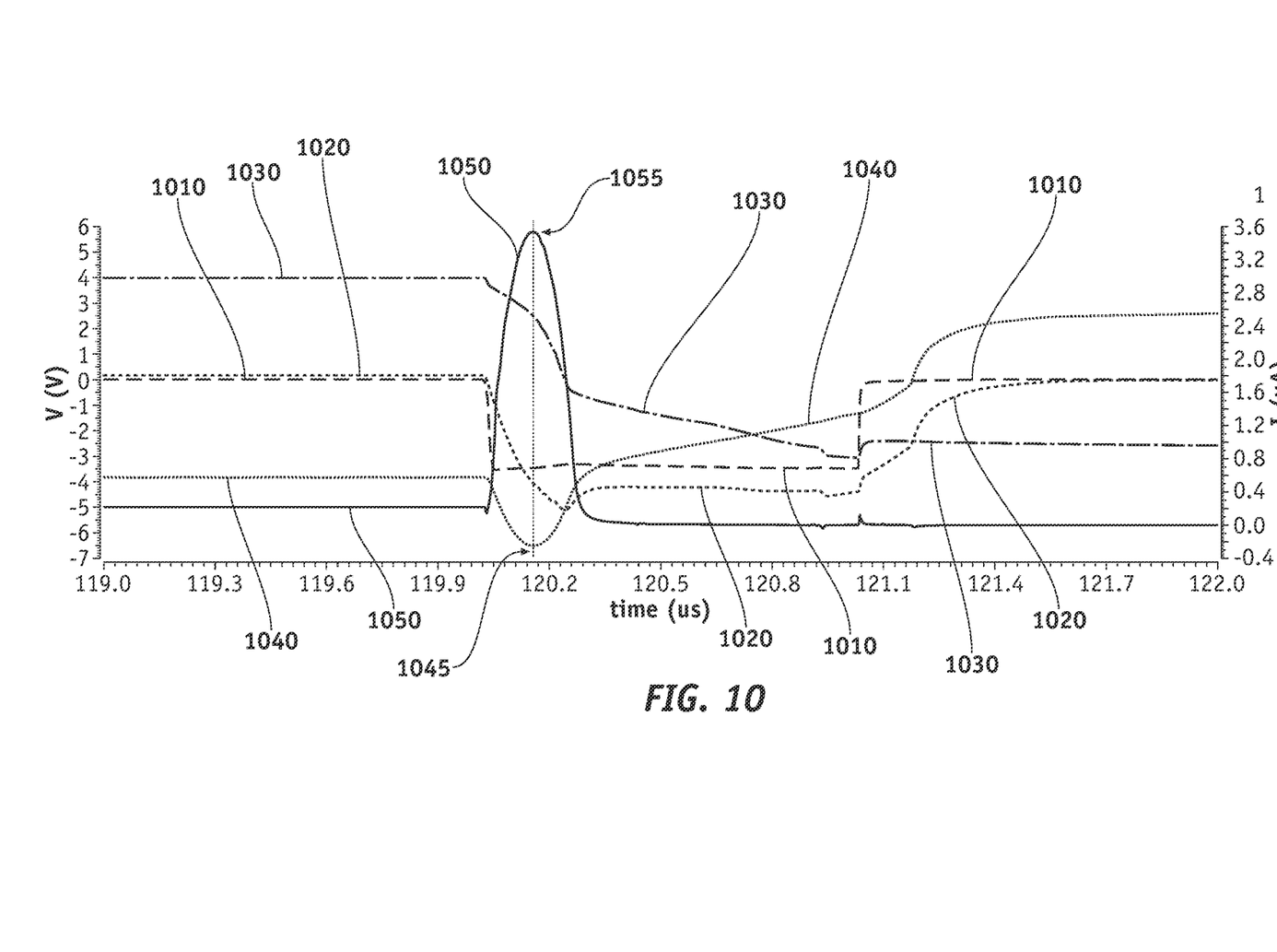
FIG. 10 shows voltage waveforms as a function of time indicating the mitigating effect of the embodiments of FIGS. 8 and 9 on a peak transient effect.

FIG. 10 shows voltage waveforms (y axis) as a function of time (x axis) indicating the mitigating effect of the embodiments of FIGS. 8 and 9 on the peak transient effect on transistor M1 described above. Curve (1010) shows the switching event control (signal input to the dynamic gate) going from a high value (e.g. 0V) to a low value (e.g. −3.4V) and then back to a high value (e.g. 0V). Curves (1020) and (1030) show the voltage on the gate and source of M1, respectively, as a function of time. The corresponding Vgs on M1 is shown by curve (1040). Curve (1050) shows the current (not voltage) through the clamping circuit (810) of FIGS. 8 and 9. Such current shows a peak value at (1055). This peak value is in correspondence of the peak transient value (1045) of Vgs which is, in this case, about −6.5V, showing an improvement of about 25% of the −8.6V peak transient value indicated above. The inventors have noted that a −6.5V voltage spike amount for a small duration like the one shown in FIG. 10 guarantees a long-term reliability of about 10 years.

Figure 11:
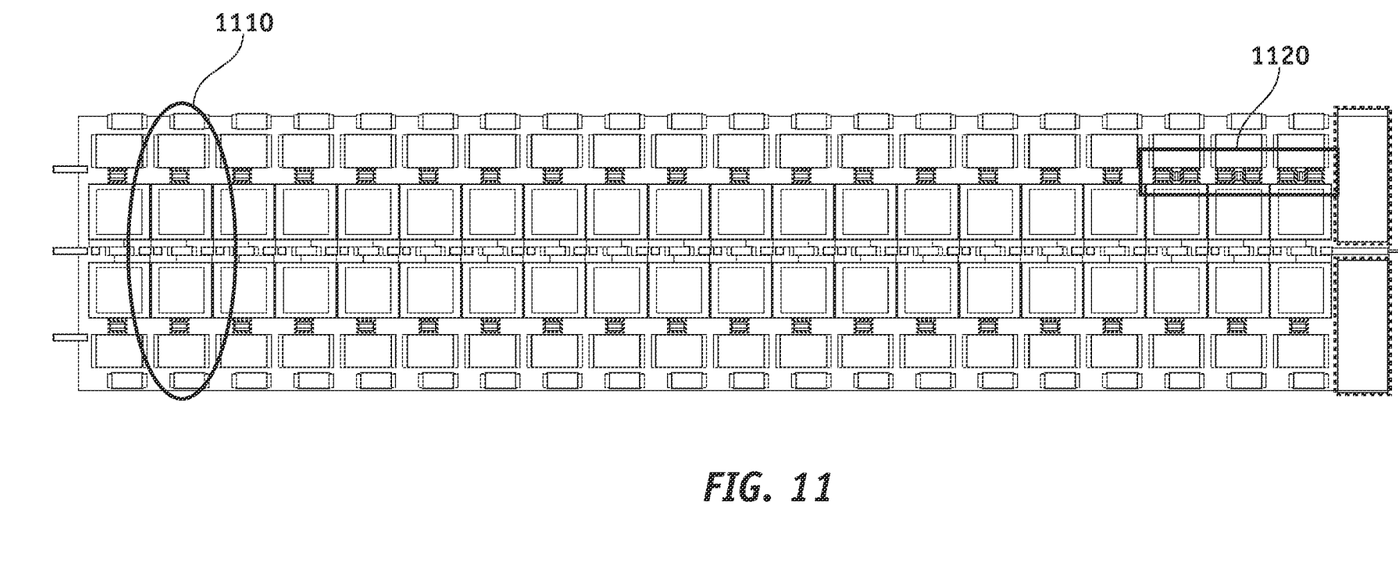
FIG. 11 shows a schematic top view of a physical layout of a dynamic gate.

While the presence of a clamping circuit on the pMOS M1 of FIG. 8 already produces positive results, the inventors have found that a dynamic gate made of a high number of cells can also benefit of a plurality of clamping circuits added to select cells of the dynamic gate. By way of example, FIG. 11 shows a schematic top view of a physical layout of a dynamic gate made of 20 cells (1110), with a clamping circuit (1120) added to the last 3 cells.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A FET switch stack comprising:
a stacked arrangement of FET switches connected at one end to an RF terminal configured to be coupled to an RF signal, the FET switch stack configured to have an ON or OFF steady state where the FET switches are respectively ON or OFF and a transition state where the FET switches transition from ON to OFF or vice versa;
a gate resistor network comprising resistors connected to gate terminals of the FET switches and one or more common gate resistors connected to the gate resistor network, the gate resistor network and the one or more common gate resistors configured to feed a gate control voltage to the gate terminals of the FET switches; and
a common gate resistor bypass arrangement comprising at least one series combination of an nMOS transistor and a pMOS transistor connected across the one or more common gate resistors and configured to
i) bypass the one or more common gate resistors during at least a transition portion of the transition state of the stacked arrangement of FET switches, the nMOS transistor and the pMOS transistor being both in an ON state during said transition portion, and
ii) not to bypass the one or more common gate resistors during at least a steady state portion of the ON steady state and the OFF steady state of the stacked arrangement of FET switches, one of the nMOS transistor and the pMOS transistor being in an OFF state and the other of the nMOS transistor and the pMOS transistor being in an ON state during said steady state portion.

2. The FET switch stack of claim 1, wherein
the transition state comprises an OFF-to-ON transition state and an ON-to-OFF transition state;
the nMOS transistor comprises an nMOS transistor gate terminal configured to transition from a first nMOS gate voltage to a second nMOS gate voltage higher than the first nMOS gate voltage during the OFF-to-ON transition state; and
the pMOS transistor comprises a pMOS transistor gate terminal configured to transition from a first pMOS gate voltage to a second pMOS gate voltage lower than the first pMOS gate voltage during the ON-to-OFF transition state.

3. The FET switch stack of claim 2, wherein
the nMOS transistor gate terminal is configured to be at the first nMOS gate voltage during at least a portion of the ON steady state and at least a portion of the OFF steady state; and
the pMOS transistor gate terminal is configured to be at the first pMOS gate voltage during at least a portion of the ON steady state and at least a portion of the OFF steady state.

4. The FET switch stack of claim 3, wherein the first nMOS gate voltage is 0 V and the first pMOS gate voltage is 0 V.

5. The FET switch stack of claim 2, further comprising control circuitry coupled to the nMOS transistor gate terminal and the pMOS transistor gate terminal, wherein the control circuitry is configured to control voltage status on the nMOS transistor gate terminal and the pMOS transistor gate terminal based on the gate control voltage.

6. The FET switch stack of claim 5, wherein the control circuitry comprises a delay circuit configured to time
transitioning of voltage at the nMOS transistor gate terminal between the first nMOS gate voltage and the second nMOS gate voltage and vice versa; and
transitioning of voltage at the pMOS transistor gate terminal between the first pMOS gate voltage and the second pMOS gate voltage and vice versa,
thereby timing duration of the bypass of the one or more common gate resistors.

7. The FET switch stack of claim 6, wherein the control circuitry comprises AND gates and level shifters.

8. The FET switch stack of claim 7, wherein the control circuitry further comprises an edge dependent pulse generator circuit.

9. The FET switch stack of claim 1, further comprising accumulated charge removal arrangements coupled to the nMOS transistor and the pMOS transistor.

10. The FET switch stack of claim 1, wherein the at least one series combination of an nMOS transistor and a pMOS transistor is a stacked arrangement of series combinations of an nMOS transistor and a pMOS transistor, each series combination connected across respective one or more common gate resistors.

11. The FET switch of claim 10, wherein at least one series combination of the nMOS transistor and the pMOS transistor comprises a clamping circuit coupled across the pMOS transistor, the clamping circuit configured to provide a current conduction path upon decrease of gate voltage of the pMOS transistor.

12. The FET switch of claim 11, wherein the clamping circuit is coupled across gate and source terminals of the pMOS transistor.

13. The FET switch of claim 11, wherein the clamping circuit comprises a diode-connected transistor in series with a diode.

14. The FET switch stack of claim 11, further comprising charge removal diodes coupled to the nMOS transistor and the pMOS transistor of the at least one series combination of the nMOS transistor and the pMOS transistor.

15. The FET switch stack of claim 11, wherein the stacked arrangement of series combinations of an nMOS transistor and a pMOS transistor comprises series combinations going from a position farthest from the gate resistor network to a position closest to the gate resistor network, the clamping circuit being in at least the series combination located closest to the gate resistor network.

16. A method to controllably bypass a resistor across a series combination of an nMOS transistor and a pMOS transistor, the series combination and the resistor configured to receive a control signal switching from a first static state to a second static state and vice versa, and output the control signal to control ON and OFF status of an RF FET switch, the method comprising:

in the first static state of the control signal, setting a gate terminal of the nMOS transistor at a first nMOS gate voltage and a gate terminal of the pMOS transistor at a first pMOS gate voltage, the first nMOS gate voltage selected to set the nMOS transistor in an ON state and the first pMOS gate voltage selected to set the pMOS transistor in an OFF state, the ON state of the nMOS transistor and the OFF state of the pMOS transistor establishing a high impedance status of the series combination and not bypassing the resistor when feeding the control signal to the RF FET switch;

during a transition of the control signal from the first static state to the second static state keeping the gate terminal of the pMOS transistor at the first pMOS gate voltage, thereby setting the pMOS transistor in an ON state, and feeding, for at least a portion of the transition, the gate terminal of the nMOS transistor with a second nMOS gate voltage higher than the first nMOS gate voltage, thereby keeping the nMOS transistor in the ON state, the ON state of the nMOS transistor and the ON state of the pMOS transistor establishing a low impedance status of the series combination and bypassing the resistor when feeding the control signal to the RF FET switch; and in the second static state of the control signal, keeping the gate terminal of the pMOS transistor at the first pMOS gate voltage, thereby keeping the pMOS transistor in the ON state, and feeding the gate terminal of the nMOS transistor with the first nMOS gate voltage, thus setting the nMOS transistor in an OFF state, the OFF state of the nMOS transistor and the ON state of the pMOS transistor re-establishing the high impedance status of the series combination and not bypassing the resistor when feeding the control signal to the RF FET switch.

17. The method of claim 16, further comprising:

during a transition of the control signal from the second static state to the first static state, keeping the gate terminal of the nMOS transistor at the first nMOS gate voltage, thereby setting the nMOS transistor in an ON state, and feeding, for at least a portion of the transition, the gate terminal of the pMOS transistor with a second pMOS gate voltage lower than the first pMOS gate voltage, thereby keeping the pMOS transistor in the ON state, the ON state of the nMOS transistor and the ON state of the pMOS transistor re-establishing the low impedance status of the series combination and bypassing the resistor when feeding the control signal to the RF FET switch.

18. The method of claim 17, wherein the RF FET switch is a stacked RF FET switch.

19. The method of claim 17, further comprising providing the pMOS transistor with a current conduction path upon decrease of voltage at the gate terminal of the pMOS transistor from the first pMOS gate voltage to the second pMOS gate voltage.

20. The method of claim 16, implemented in a silicon-on-insulator (SOI) process.

* * * * *